United States Patent
Masuda et al.

(10) Patent No.: US 9,496,463 B2
(45) Date of Patent: *Nov. 15, 2016

(54) PHOSPHOR, LIGHT EMITTING APPARATUS, AND LIQUID CRYSTAL DISPLAY APPARATUS USING THE SAME

(71) Applicant: Sharp Kabushiki Kaisha, Osaka-shi, Osaka (JP)

(72) Inventors: Masatsugu Masuda, Osaka (JP); Masamichi Harada, Osaka (JP); Hitoshi Matsushita, Osaka (JP); Kenji Terashima, Osaka (JP)

(73) Assignee: GE PHOSPHORS TECHNOLOGY, LLC, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/248,664

(22) Filed: Apr. 9, 2014

(65) Prior Publication Data

US 2014/0218658 A1 Aug. 7, 2014

Related U.S. Application Data

(63) Continuation of application No. 13/500,803, filed as application No. PCT/JP2010/072684 on Dec. 16, 2010, now Pat. No. 8,709,283.

(30) Foreign Application Priority Data

Jan. 8, 2010 (JP) ................................ 2010-003058

(51) Int. Cl.
| | |
|---|---|
| *H01L 33/50* | (2010.01) |
| *G02F 1/1335* | (2006.01) |
| *G02F 1/13357* | (2006.01) |
| *C09K 11/64* | (2006.01) |
| *C09K 11/08* | (2006.01) |
| *C09K 11/77* | (2006.01) |
| *C09K 11/62* | (2006.01) |

(52) U.S. Cl.
CPC ......... *H01L 33/504* (2013.01); *C09K 11/0883* (2013.01); *C09K 11/7734* (2013.01); *G02F 1/1336* (2013.01); *G02F 1/133603* (2013.01); *H01L 33/502* (2013.01); *Y10T 428/2982* (2015.01)

(58) Field of Classification Search
CPC ............ H01L 33/504; C09K 11/0883; C09K 11/7734
See application file for complete search history.

(56) References Cited

U.S. PATENT DOCUMENTS

| | | | |
|---|---|---|---|
| 7,833,436 B2 | 11/2010 | Shimooka et al. | |
| 8,084,942 B2 | 12/2011 | Hanamoto et al. | |
| 8,147,715 B2* | 4/2012 | Hirosaki | C09K 11/0883 |
| | | | 252/301.4 F |
| 8,404,152 B2* | 3/2013 | Emoto | C04B 35/597 |
| | | | 252/301.4 F |
| 8,518,300 B2 | 8/2013 | Sakai et al. | |
| 8,709,283 B2* | 4/2014 | Masuda | C09K 11/0883 |
| | | | 252/301.4 F |
| 2001/0001207 A1 | 5/2001 | Shimizu et al. | |
| 2002/0039002 A1 | 4/2002 | Fukasawa et al. | |
| 2004/0000868 A1 | 1/2004 | Shimizu et al. | |
| 2004/0012027 A1 | 1/2004 | Keller et al. | |
| 2007/0012931 A1 | 1/2007 | Lee et al. | |
| 2007/0108896 A1 | 5/2007 | Hirosaki | |
| 2007/0215892 A1 | 9/2007 | Ishii et al. | |
| 2008/0258602 A1 | 10/2008 | Masuda et al. | |
| 2008/0272688 A1 | 11/2008 | Yoshimura | |
| 2009/0014741 A1 | 1/2009 | Masuda et al. | |
| 2009/0129052 A1 | 5/2009 | Hirosaki | |
| 2009/0153028 A1 | 6/2009 | Hirosaki | |
| 2009/0194781 A1 | 8/2009 | Harada | |
| 2009/0284948 A1 | 11/2009 | Yamao et al. | |
| 2010/0053932 A1 | 3/2010 | Emoto et al. | |
| 2010/0176713 A1 | 7/2010 | Hanamoto et al. | |
| 2010/0237767 A1 | 9/2010 | Emoto et al. | |
| 2012/0305844 A1 | 12/2012 | Emoto et al. | |

FOREIGN PATENT DOCUMENTS

| | | |
|---|---|---|
| EP | 1 964 905 | 9/2008 |
| JP | 2005-255895 | 9/2005 |
| JP | 2006-70077 | 3/2006 |
| JP | 2007-308593 | 11/2007 |

(Continued)

OTHER PUBLICATIONS

International Search Report mailed Jan. 25, 2011, directed to International Application No. PCT/JP2010/072684, 4 pages.

(Continued)

*Primary Examiner* — Carol M Koslow

(74) *Attorney, Agent, or Firm* — Meagher Emanuel Laks Goldberg & Liao, LLP

(57) ABSTRACT

A phosphor as a divalent europium-activated oxynitride green light emitting phosphor which is a β-type SiAlON substantially represented by a general formula (A): $Eu_aSi_bAl_cO_dN_e$ (where a, b, c, d, and e are numbers satisfying $0.005 \leq a \leq 0.4$, $b+c=12$, and $d+e=16$), and having an average particle size (d1) (determined by an air permeability method) of 9 to 16 μm, a median diameter (50% D) in particle size distribution of 12.5 to 35 μm, 50% D/d1 of 1.4 to 2.2, and an absorptance at 600 nm of not more than 8.0%, and a light emitting apparatus, a BL light source apparatus, and a liquid crystal display device using the same are provided, to provide a light emitting apparatus with a high efficiency and a stable characteristic and a liquid crystal display apparatus using the same by using the β-type SiAlON having controlled dispersibility and improved transparency.

9 Claims, 1 Drawing Sheet

(56) References Cited

FOREIGN PATENT DOCUMENTS

| JP | 2008-127547 | | 6/2008 |
|---|---|---|---|
| WO | WO 2007066733 | * | 6/2007 |
| WO | WO-2007/129713 | | 11/2007 |
| WO | WO-2008/004640 | | 1/2008 |
| WO | WO-2008/062781 | | 5/2008 |
| WO | WO 2008062781 | * | 5/2008 |
| WO | WO-2009/008250 | | 1/2009 |

OTHER PUBLICATIONS

Masuda et al., Office Action mailed Apr. 5, 2013, directed to U.S. Appl. No. 11/944,052, 18 pages.
Masuda, M. et al., U.S. Office Action mailed Jul. 30, 2013, directed to U.S. Appl. No. 13/729,191, 7 pages.
Masuda et al., Notice of Allowance mailed Oct. 17, 2013, directed to U.S. Appl. No. 11/944,052, 11 pages.
Hanamoto et al., Notice of Allowance mailed Nov. 19, 2013, directed to U.S. Appl. No. 13/303,907, 10 pages.
Masuda et al., U.S. Office Action mailed Feb. 3, 2014, directed to U.S. Appl. No. 13/729,191, 7 pgs.
Masuda et al., U.S. Notice of Allowance mailed Mar. 20, 2014, directed to U.S. Appl. No. 13/729,191, 7 pgs.
Hanamoto et al., U.S. Advisory Action mailed Jan. 14, 2015, directed to U.S. Appl. No. 14/176,442; 3 pages.
Hanamoto et al., U.S. Office Action mailed Feb. 27, 2015, directed to U.S. Appl. No. 14/176,442; 12 pages.
Masuda et al., U.S. Office Action mailed Mar. 10, 2015, directed to U.S. Appl. No. 14/615,017; 10 pages.
Masuda et al., U.S. Office Action mailed Apr. 9, 2015, directed to U.S. Appl. No. 14/166,231; 9 pages.
Hanamoto et al., U.S. Office Action mailed Apr. 28, 2014, directed to U.S. Appl. No. 14/176,442; 7 pages.
Masuda et al., U.S. Office Action mailed Sep. 22, 2014, directed to U.S. Appl. No. 14/470,153; 5 pages.
Hanamoto et al., U.S. Office Action mailed Oct. 30, 2014, directed to U.S. Appl. No. 14/176,442; 7 pages.
Hanamoto et al., U.S. Office Action mailed Apr. 17, 2014, directed to U.S. Appl. No. 13/263,053; 9 pages.
Hanamoto et al., U.S. Office Action mailed Jul. 31, 2015, directed to U.S. Appl. No. 14/176,442, 12 pages.
Masuda et al., U.S. Office Action mailed Oct. 2, 2015, directed to U.S. Appl. No. 14/166,231; 9 pages.
Masuda et al., U.S. Notice of Allowance mailed Dec. 13, 2013, directed to U.S. Appl. No. 13/500,803, 10 pages.
Masuda et al., U.S. Office Action mailed Dec. 16, 2015, directed to U.S. Appl. No. 14/936,037, 16 pages.
European Office Action issued in connection with corresponding EP Application No. 10 842 184.3 on Apr. 14, 2016.
Tolochko et al., "Absorptance of powder materials suitable for laser sintering", Rapid Prototyping Journal, vol. 6, No. 3, Jan. 1, 2000, pp. 155-160.
Hanssen et al., "Integrated-Sphere System and Method for Absolute Measurement of Transmittance, Reflectance and Absorptance of Specular Samples", Applied Optics, vol. 40, No. 19, Jul. 1, 2001, pp. 3196-3204, Optical Society of America, Washington, DC, US.

* cited by examiner

PHOSPHOR, LIGHT EMITTING APPARATUS, AND LIQUID CRYSTAL DISPLAY APPARATUS USING THE SAME

CROSS-REFERENCE TO RELATED APPLICATIONS

This application is a continuation of U.S. patent application Ser. No. 13/500,803, filed Apr. 6, 2012, now U.S. Pat. No. 8,709,283, which was a national stage application under 35 USC 371 of International Application No. PCT/JP2010/072684, filed on Dec. 16, 2010, which claims priority to Japanese Patent Application No. 2010-003058, filed on Jan. 8, 2010, the entire contents of which are hereby incorporated by reference.

FIELD OF THE INVENTION

The present invention relates to a phosphor suitable for a light emitting apparatus, a light emitting apparatus using the same in a light converter, in particular a light emitting apparatus having a stable characteristic, and a liquid crystal display apparatus using the same.

BACKGROUND OF THE INVENTION

Light emitting apparatuses using a combination of a semiconductor light emitting element and a phosphor have been attracting attention as next-generation light emitting apparatuses expected to realize low power consumption, compact size, high luminance, high color gamut, and high color rendition, and have been actively researched and developed. Primary light emitted from a light emitting element in a range from ultraviolet light having a longer wavelength to blue light, i.e., 380 to 480 nm, is usually used. Light converters using various phosphors suitable for this application have also been proposed.

At present, for white light emitting apparatuses of this type, a combination of a light emitting element emitting blue light (peak wavelength: around 460 nm) and a trivalent cerium-activated $(Y, Gd)_3(Al, Ga)_5O_{12}$ phosphor or a divalent europium-activated $2(Sr, Ba)O \cdot SiO_2$ phosphor, which is excited by the blue color and emits yellow light, is mainly used. However, color gamut (NTSC ratio) in such light emitting apparatuses is about 70%, and higher color gamut has recently been required even in compact LCDs.

Further, for the light emitting apparatuses of this type, an attempt has recently been made not only to improve conversion efficiency (brightness) but also to increase input energy to achieve higher brightness. When input energy is increased, it becomes necessary to efficiently dissipate heat from an entire light emitting apparatus including a light converter. Thus, development of the structure of the entire light emitting apparatus, materials therefor, and the like has been pursued. However, a temperature rise in the light emitting element and the light converter during operation is still inevitable.

However, the trivalent cerium-activated $(Y, Gd)_3(Al, Ga)_5O_{12}$ phosphor particularly has a technical problem that it is impossible to set high input energy, because the luminance (brightness) at 100° C. decreases to about 85%, compared to the luminance of 100% at 25° C. Therefore, it is also urgently necessary to improve the temperature characteristic of phosphors to be used for the light emitting apparatuses of this type.

For these technical problems, it is known that the use of a divalent europium-activated oxynitride green light emitting phosphor which is a β-type SiAlON represented by $Eu_aSi_bAl_cO_dN_e$ results in a light emitting apparatus having good color gamut (NTSC ratio) and temperature characteristic.

However, the divalent europium-activated oxynitride green light emitting phosphor which is a β-type SiAlON is basically a columnar crystal, and, due to its simple composition, if an attempt is made to maintain its crystal structure, sintered bodies (aggregates) are likely to be generated. In an excessively large columnar crystal (needle crystal), crystal growth is insufficient, and a good characteristic (brightness) cannot be obtained. Further, since a sintered body (aggregate) is not a uniform single particle, a good characteristic (brightness) cannot be obtained despite its size, due to absorption of light at a particle boundary and the like. In particular, presence of many columnar crystals (needle crystals) and sintered bodies (aggregates) causes technical problems that sufficient brightness cannot be obtained in the light emitting apparatus, and that a reduction in brightness and large fluctuations in chromaticity are caused even during continuous lighting.

Therefore, it is urgently necessary to develop a divalent europium-activated oxynitride green light emitting phosphor which is a β-type SiAlON represented by $Eu_aSi_bAl_cO_dN_e$ having a controlled shape, and a light emitting apparatus using the same having a stable characteristic. Japanese Patent Laying-Open No. 2005-255895 (Patent Literature 1), for example, has descriptions regarding a β-type SiAlON that its crystal phase is a single crystal having an average particle diameter of not less than 50 nm and not more than 20 μm, and that the particle size of synthesized phosphor powder is adjusted to have an average particle diameter of not less than 50 nm and not more than 20 μm. Patent Literature 1 also describes that, if the average particle diameter is more than 20 μm, it is not preferable because dispersibility is deteriorated and color unevenness is caused when the phosphor powder is applied to an illumination device or an image display apparatus, and that, if the average particle diameter is less than 50 nm, the powder aggregates and causes deterioration in operability. However, Patent Literature 1 has no descriptions regarding dispersibility (i.e., the degree of aggregation (sintering)), regarding the relationship between dispersibility and an absorptance at 600 nm, and regarding the initial characteristic and the life characteristic of a light emitting apparatus.

PATENT LITERATURE

PTL 1: Japanese Patent Laying-Open No. 2005-255895

SUMMARY OF THE INVENTION

The present invention has been made to solve the aforementioned problems. An object of the present invention is to provide a light emitting apparatus with a high efficiency and a stable characteristic, by using a β-type SiAlON having controlled dispersibility and improved transparency.

As a result of elaborate investigation, study and development for solving the aforementioned problems, the present inventors have found that it is possible to obtain a light emitting apparatus having a significantly good initial characteristic (brightness) and a good life characteristic, by using a β-type SiAlON having crystal transparency improved by not only optimizing the chemical composition of the β-type SiAlON but also improving dispersibility of particles thereof. More specifically, the present invention is as follows.

A phosphor of the present invention is a divalent europium-activated oxynitride green light emitting phosphor which is a β-type SiAlON substantially represented by a general formula (A): $Eu_aSi_bAl_cO_dN_e$ (where a, b, c, d, and e are numbers satisfying 0.0055≤a≤0.4, b+c=12, and d+e=16), having an average particle size (d1) (determined by an air permeability method) of 9 to 16 μm, a median diameter (50% D) in particle size distribution of 12.5 to 35 μm, 50% D/d1 of 1.4 to 2.2, and an absorptance at 600 nm of not more than 8.0%, and suppressing a reduction in efficiency due to self absorption at a particle boundary.

Preferably, the green light emitting phosphor of the present invention has d1 satisfying 10 μm≤d1≤13 50% D/d1 of 1.6 to 2.0, and an absorptance at 600 nm of not more than 7.0%.

Preferably, in the green light emitting phosphor of the present invention, "c" satisfies c≤0.3 in the general formula (A).

Preferably, in the green light emitting phosphor of the present invention, "a" satisfies 0.01≤a≤0.2 in the general formula (A).

The present invention also provides a light emitting apparatus, including: a light emitting element which is a gallium nitride-based semiconductor emitting primary light having a peak wavelength of 430 to 480 nm; and a light converter absorbing a part of the primary light to emit secondary light having a wavelength longer than a wavelength of the primary light, the light converter including a divalent europium-activated oxynitride green light emitting phosphor which is a β-type SiAlON substantially represented by a general formula (A): $Eu_aSi_bAl_cO_dN_e$ (where a, b, c, d, and e are numbers satisfying 0.005≤a≤0.4, b+c=12, and d+e=16), and having an average particle size (d1) (determined by an air permeability method) of 9 to 16 μm, a median diameter (50% D) in particle size distribution of 12.5 to 35 μm, 50% D/d1 of 1.4 to 2.2, and an absorptance at 600 nm of not more than 8.0%.

Preferably, in the light emitting apparatus of the present invention, the green light emitting phosphor has d1 satisfying 10 μm≤d1≤13 μm, 50% D/d1 of 1.6 to 2.0, and an absorptance at 600 nm of not more than 7.0%.

Preferably, in the green light emitting phosphor in the light emitting apparatus of the present invention, "c" satisfies c≥0.3 in the general formula (A).

Preferably, in the green light emitting phosphor in the light emitting apparatus of the present invention, "a" satisfies 0.01≤a≤0.2 in the general formula (A).

Preferably, a red light emitting phosphor is additionally used in the light converter for the purpose of adjusting the color of light to be emitted from the light emitting apparatus of the present invention, and as the red light emitting phosphor, a divalent europium-activated nitride red light emitting phosphor substantially represented by a general formula (B): $(MI_{1-x}Eu_x)MIISiN_3$ (where MI indicates at least one alkaline-earth metal element selected from Mg, Ca, Sr, and Ba, MII indicates at least one trivalent metal element selected from Al, Ga, In, Sc, Y, La, Gd, and Lu, and x is a number satisfying 0.001≤x≤0.10) is used.

Preferably, in the red light emitting phosphor in the light emitting apparatus of the present invention, MII in the general formula (B) is at least one element selected from Al, Ga, and In.

The present invention also provides a back-light light source apparatus including a plurality of the above-noted light emitting apparatuses of the present invention as point light sources.

The present invention further provides a liquid crystal display apparatus including a liquid crystal panel and the above-noted back-light light source apparatus of the present invention disposed on a back surface of the liquid crystal panel.

According to the present invention, a light emitting apparatus that can efficiently absorb the primary light from the light emitting element, and can obtain white light with high efficiency, excellent color gamut (NTSC ratio), and a good life characteristic, as well as a phosphor suitably used for the same, can be provided.

DETAILED DESCRIPTION OF THE INVENTION

Figure 1:
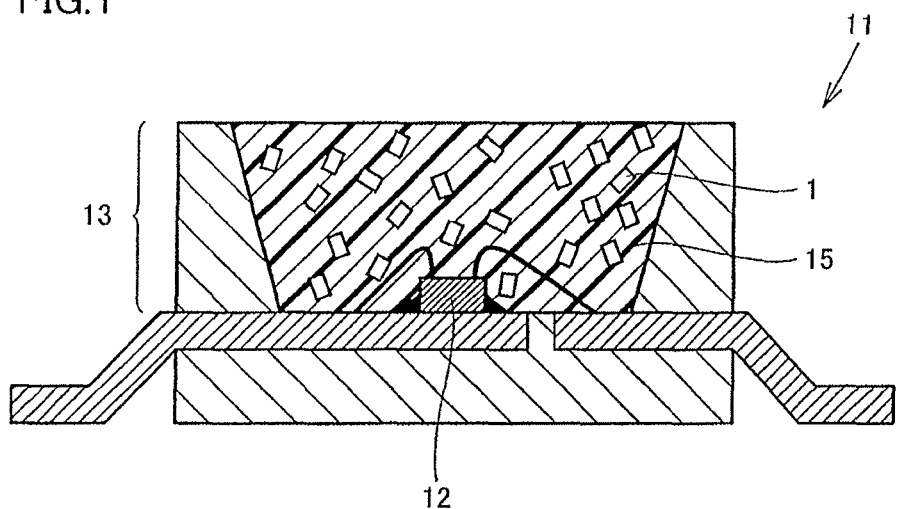
FIG. 1 is a cross-sectional view schematically showing a light emitting apparatus 11 in a preferable example of the present invention.

A phosphor of the present invention is a divalent europium-activated oxynitride green light emitting phosphor which is a β-type SiAlON represented by the following general formula (A):

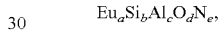
General formula (A):

where the value of "a" is 0.005≤a≤0.4, b+c=12, and d+e=16. In the general formula (A), if the value of "a" is less than 0.005, inconveniently, sufficient brightness cannot be obtained, and if the value of "a" exceeds 0.4, inconveniently, brightness is significantly reduced due to concentration quenching and the like. In terms of stability of the characteristic and host crystal homogeneity, the value of "a" in the general formula (A) is preferably 0.01≤a≤0.2.

Further, the phosphor of the present invention has an average particle size (d1) (determined by an air permeability method) of 9 to 16 μm. If d1 is less than 9 μm, many columnar crystals (needle crystals) and sintered bodies (aggregates) having insufficient crystal growth are present, and sufficient brightness cannot be obtained. On the other hand, if d1 exceeds 16 μm, presence of large sintered bodies (aggregates) is increased, and sufficient brightness cannot be obtained despite its size. In terms of stability of the characteristic and host crystal homogeneity, d1 is preferably 10 μm≤d1≤13 μm.

Furthermore, 50% D/d1 as a formula representing crystal dispersibility (i.e., an index indicating a presence proportion of a single particle) is limited to a range of 1.4 to 2.2. Although 50% D/d1 is ideally 1.0, if 50% D/d1 is less than 1.4, there is a tendency that pulverization is excessive, and a reduction in brightness is nonnegligible. On the other hand, if 50% D/d1 exceeds 2.2, presence of sintered bodies (aggregates) is increased, causing a significant reduction in brightness. In terms of stability of the characteristic and host crystal homogeneity, 50% D/d1 is preferably 1.6≤50% D/d1≤2.0.

Therefore, when the average particle size (d1) (determined by the air permeability method) and the range of 50% D/d1 are determined, a median diameter (50% D) in particle size distribution is determined accordingly. Namely, the median diameter will have a range of 12.5 to 35 μm.

The divalent europium-activated oxynitride green light emitting phosphor which is a β-type SiAlON having the average particle size (d1) (determined by the air permeability method) and the range of 50% D/d1 described above is excellent in body color, and has an absorptance at 600 nm of not more than 8.0%. If the absorptance exceeds 8.0%, absorption of a long-wavelength component (particularly in a red color region) is nonnegligible, causing a significant reduction in brightness in white color. In terms of stability of the characteristic and host crystal homogeneity, the absorptance at 600 nm is preferably not more than 7.0%.

Specifically, examples of the divalent europium-activated oxynitride green light emitting phosphor which is a β-type SiAlON represented by the above formula include $Eu_{0.05}Si_{11.50}Al_{0.50}O_{0.30}N_{15.70}$, $Eu_{0.10}Si_{11.00}Al_{1.00}O_{0.40}N_{15.60}$, $Eu_{0.30}Si_{9.80}Al_{2.20}O_{1.00}N_{15.00}$, $Eu_{0.5}Si_{10.00}Al_{2.00}O_{0.50}N_{15.50}$, $Eu_{0.01}Si_{11.60}Al_{0.40}O_{0.20}N_{15.80}$, $Eu_{0.005}Si_{11.70}Al_{0.30}O_{0.15}N_{15.85}$, $Eu_{0.25}Si_{11.65}Al_{0.35}O_{0.30}N_{15.70}$, $Eu_{0.40}Si_{11.35}Al_{0.65}O_{0.35}N_{15.65}$, $Eu_{0.05}Si_{11.55}Al_{0.45}O_{0.35}N_{15.65}$, and the like. The present invention is, however, not limited thereto, as a matter of course.

It is to be noted that the average particle size (d1) (determined by the air permeability method) refers to a value measured by the Lea-Nurse method, the Blaine method, or the like, and can be measured using, for example, an air permeability-type powder specific surface area measuring apparatus (manufactured by Tsutsui Scientific Instruments Co., Ltd.).

Further, the above-noted median diameter (50% D) refers to a value measured using a particle size distribution measuring apparatus (LA-920 manufactured by HORIBA, Ltd.). It is to be noted that, although an electrolyte (sodium hexametaphosphate) was used when particle size distribution was measured, preliminary dispersion by ultrasound was not performed.

Furthermore, the absorptance at 600 nm can be measured using, for example, a spectrum measuring apparatus MCPD7000 (manufactured by Otsuka Electronics Co., Ltd.).

The phosphor of the present invention can be fabricated by any conventionally-known appropriate method. However, in order to achieve uniform crystal growth, a method such as setting an Al concentration (c) to 0.3 or more, accurately controlling an oxygen concentration, accurately controlling densities and volumes of raw materials in a firing container, optimizing a temperature profile at the time of synthesis, or the like may be used. The present invention is, however, not limited thereto.

FIG. 1 is a cross-sectional view schematically showing a light emitting apparatus 11 in a preferable example of the present invention. A gallium nitride (GaN)-based semiconductor is used for a light emitting element 12 used in light emitting apparatus 11 of the present invention in the example shown in FIG. 1, in terms of efficiency. In light emitting apparatus 11 of the present invention, light emitting element 12 that emits primary light having a peak wavelength in the range of 430 to 480 nm is used.

In light emitting apparatus 11 of the present invention, a medium 15 of a light converter 13 is not specifically limited as long as light converter 13 contains the above-noted phosphor of the present invention and can absorb a part of the primary light emitted from light emitting element 12 and emit secondary light having a wavelength equal to or longer than that of the primary light. For example, a transparent resin such as epoxy resin, silicone resin, urea resin, or the like can be used as medium 15, although the present invention is not limited thereto. Specifically, a thermosetting silicone resin sealing material or the like is suitably used as medium 15. Further, light converter 13 may contain any appropriate additive such as $SiO_2$, $TiO_2$, $ZrO_2$, $Al_2O_3$, $Y_2O_3$, as a matter of course, to such an extent that the effect of the present invention is not inhibited.

Figure 2:
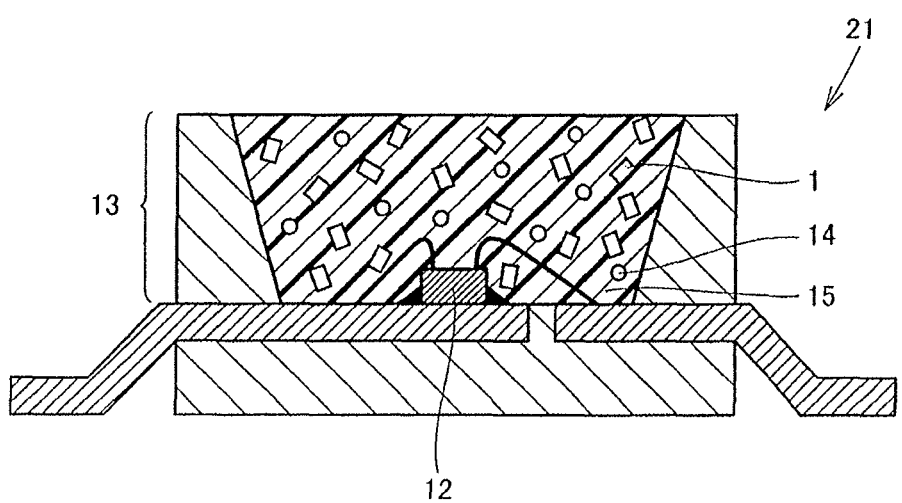
FIG. 2 is a cross-sectional view schematically showing a light emitting apparatus 21 in another preferable example of the present invention.

FIG. 2 is a cross-sectional view schematically showing a light emitting apparatus 21 in another preferable example of the present invention. Light converter 13 of light emitting apparatus 21 of the present invention may include a phosphor 14 other than a phosphor 1 of the present invention described above, as in the example shown in FIG. 2, as a matter of course. Phosphor 14 that may be included in light converter 13 other than phosphor 1 of the present invention is not specifically limited. However, since phosphor 1 of the present invention is composed of a green light emitting phosphor, a divalent europium-activated nitride red light emitting phosphor expressed by the following general formula (B) is suitable as phosphor 14, considering that a light emitting apparatus presenting white light by color mixture can be realized.

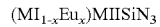  General formula (B):

In the general formula (B), MI indicates at least one alkaline-earth metal element selected from Mg, Ca, Sr, and Ba. Further, in the general formula (B), MII indicates at least one trivalent metal element selected from Al, Ga, In, Sc, Y, La, Gd, and Lu. Among them, MII is preferably at least one element selected from Al, Ga, and In, since red light can be emitted even more efficiently. Furthermore, in the general formula (B), the value of "x" is $0.001 \leq x \leq 0.10$, and preferably $0.005 \leq x \leq 0.05$. If the value of "x" is less than 0.001, there is a tendency that sufficient brightness cannot be obtained, and if the value of "x" exceeds 0.10, there is a tendency that brightness is greatly reduced due to concentration quenching and the like.

Specifically, examples of such a divalent europium-activated nitride red light emitting phosphor include $(Ca_{0.99}Eu_{0.01})AlSiN_3$, $(Ca_{0.97}Mg_{0.02}Eu_{0.01})(Al_{0.99}Ga_{0.01})SiN_3$, $(Ca_{0.98}Eu_{0.02})AlSiN_3$, $(Ca_{0.58}Sr_{0.40}Eu_{0.02})(Al_{0.98}In_{0.02})SiN_3$, $(Ca_{0.99}Eu_{0.001})AlSiN_3$, $(Ca_{0.895}Sr_{0.100}Eu_{0.005})AlSN_3$, $(Ca_{0.79}Sr_{0.20}Eu_{0.01})AlSiN_3$, $(Ca_{0.98}Eu_{0.02})(Al_{0.95}Ga_{0.05})SiN_3$, $(Ca_{0.20}Sr_{0.79}Eu_{0.01})AlSiN_3$, $(Ca_{0.58}Sr_{0.40}Eu_{0.02})AlSiN_3$, and the like, although the present invention is not limited thereto, as a matter of course.

When the above-noted divalent europium-activated nitride red light emitting phosphor is used, the mixture ratio thereof to the phosphor of the present invention in light converter 13 is preferably in the range of 1 to 35% by weight and more preferably in the range of 5 to 25% by weight with respect to the phosphor of the present invention, although not being specifically limited.

Light converter 13 in light emitting apparatus 11 of the present invention may include a phosphor other than the phosphor of the present invention, excluding the above-noted divalent europium-activated nitride red light emitting phosphor, to such an extent that the effect of the present invention is not inhibited. Further, such a phosphor other than the phosphor of the present invention and the above-noted divalent europium-activated nitride red light emitting phosphor may also be included in light converter 13, in addition to the phosphor of the present invention and the above-noted divalent europium-activated nitride red light emitting phosphor.

A gallium nitride (GaN)-based semiconductor is used for light emitting element 12 used in light emitting apparatus 21 of the present invention, in terms of efficiency. In light emitting apparatus 21 of the present invention, light emitting element 12 that emits primary light having a peak wavelength in the range of 430 to 480 nm is used. The use of a light emitting element having a peak wavelength of less than 430 nm reduces contribution of a blue component, worsens color rendition, and thus is not practical. On the other hand, the use of a light emitting element having a peak wavelength of greater than 480 nm reduces brightness in white color and thus is not practical. In terms of efficiency, light emitting element 12 in light emitting apparatus 21 of the present invention preferably emits primary light in the range of 440 to 470 nm.

Light emitting apparatuses 11, 21 of the present invention can be manufactured by any conventionally-known appropriate technique, and the manufacturing method is not specifically limited. For example, it may be manufactured by mixing phosphor 1 of the present invention (and phosphor 14 other than the phosphor of the present invention, as necessary) into a sealing material made of thermosetting silicone resin as medium 15 and kneading the same, sealing light emitting element 12 therein, and performing molding.

The present invention also provides a back-light light source apparatus including a plurality of the above-noted light emitting apparatuses of the present invention as point light sources. The present invention further provides a liquid crystal display apparatus including a liquid crystal panel and the above-noted back-light light source apparatus of the present invention disposed on a back surface of the liquid crystal panel. The liquid crystal display apparatus of the present invention is configured, for example, by disposing a direct back-light light source apparatus in which a plurality of light emitting apparatuses are prepared and mounted in a matrix on a casing, and disposing an optical sheet and a liquid crystal panel on the back-light light source apparatus. Further, the direct back-light light source apparatus may be replaced by an edge-light type back-light light source apparatus having a configuration in which a plurality of the above-noted light emitting apparatuses of the present invention are prepared and disposed on a side surface of a light guide plate, and a reflective plate is installed on a back surface of the light guide plate, to obtain light from a front surface of the light guide plate.

Hereinafter, the present invention will be described in more detail, taking examples and comparative examples. However, the present invention is not limited thereto.

A gallium nitride (GaN)-based semiconductor having a peak wavelength at 450 nm was used as a light emitting element. A light converter was produced by using a green light emitting phosphor having a composition of $Eu_{0.05}Si_{11.55}Al_{0.45}O_{0.35}N_{15.65}$ (β-type SiAlON), and having an average particle size (d1) of 11.3 μm, a median diameter (50% D) of 18.6 μm, 50% D/d1 of 1.65, and an absorptance at 600 nm of 5.9%, as characteristic values. It is to be noted that the phosphor was prepared by mainly controlling the Al concentration (c) to 0.50. The light converter was fabricated by dispersing the phosphor in a prescribed proportion in a sealing material made of thermosetting silicone resin as a medium, and then sealing the light emitting element therein. A light emitting apparatus of Example 1 was thus fabricated. For the light emitting apparatus of Example 1 fabricated as described above, brightness was measured in the beginning and after 5000 hours. The brightness was measured by turning on the light emitting apparatus at a forward current (IF) of 30 mA and measuring optical power (photocurrent) from the light emitting apparatus.

On the other hand, a light emitting apparatus of Comparative Example 1 was fabricated in a similar manner as above, except that the phosphor used was a green light emitting phosphor having a composition of $Eu_{0.05}Si_{11.93}Al_{0.07}O_{0.10}N_{15.90}$ (β-type SiAlON), and having an average particle size (d1) of 6.5 μm, a median diameter (50% D) of 19.5 μm, 50% D/d1 of 3.00, and an absorptance at 600 nm of 12.0%, as characteristic values. The characteristic was evaluated similarly.

The results of Example 1 and Comparative Example 1 are shown in Table 1. Table 1 shows that the light emitting apparatus of Example 1 is significantly brighter and has smaller fluctuations in brightness than the light emitting apparatus of Comparative Example 1.

TABLE 1

|  | Beginning Brightness (Relative Value) | After 5000 Hours Brightness (Maintenance Rate) |
| --- | --- | --- |
| Example 1 | 109.8% | 90.3% |
| Comparative Example 1 | 100.0% | 70.6% |

Light emitting apparatuses of Examples 2, 3 and Comparative Examples 2, 3 were fabricated in a manner similar to Example 1, except for using phosphors having various average particle sizes (d1), median diameters (50% D), values of 50% D/d1, and absorptances at 600 nm as shown in Table 2. The results of the characteristic (brightness) measured in a manner similar to Example 1 are shown in Table 3. Table 3 shows that the light emitting apparatuses of Examples 2, 3 are significantly brighter and have smaller fluctuations in brightness than the light emitting apparatuses of Comparative Examples 2, 3.

TABLE 2

|  | Composition | Average Particle Size (d1) (μm) | 50% D (μm) | 50% D/d1 | Absorptance at 600 nm (%) |
| --- | --- | --- | --- | --- | --- |
| Example 2 | $Eu_{0.5}Si_{11.50}Al_{0.50}O_{0.30}N_{15.70}$ | 13.1 | 21.0 | 1.60 | 6.30 |
| Comparative Example 2 | $Eu_{0.5}Si_{11.95}Al_{0.05}O_{0.06}N_{15.94}$ | 7.3 | 17.5 | 2.40 | 13.6 |
| Example 3 | $Eu_{0.10}Si_{11.00}Al_{1.00}O_{0.40}N_{15.60}$ | 9.5 | 15.0 | 1.58 | 5.70 |
| Comparative Example 3 | $Eu_{0.10}Si_{11.90}Al_{0.10}O_{0.10}N_{15.90}$ | 5.9 | 16.8 | 2.85 | 14.7 |

TABLE 3

|  | Beginning Brightness (Relative Value) | After 5000 Hours Brightness (Maintenance Rate) |
| --- | --- | --- |
| Example 2 | 110.8% | 91.6% |
| Comparative Example 2 | 100.0% | 72.1% |
| Example 3 | 109.0% | 90.9% |
| Comparative Example 3 | 100.0% | 71.3% |

A gallium nitride (GaN)-based semiconductor having a peak wavelength at 460 nm was used as a light emitting element. A light converter was produced by using: a green light emitting phosphor having a composition of $Eu_{0.05}Si_{11.55}Al_{0.45}O_{0.35}N_{15.65}$ (β-type SiAlON), and having an average particle size (d1) of 11.3 μm, a median diameter (50% D) of 18.6 μm, 50% D/d1 of 1.65, and an absorptance at 600 nm of 5.9%, as characteristic values; and a divalent europium-activated nitride red light emitting phosphor having a composition of $(Ca_{0.99}Eu_{0.01})AlSiN_3$ (D50 value: 12.8 μm). The light converter was fabricated by dispersing the phosphor and the red light emitting phosphor in prescribed proportions in a sealing material made of thermosetting silicone resin as a medium, and then sealing the light emitting element therein. A light emitting apparatus of Example 4 was thus fabricated. For the light emitting apparatus of Example 4 fabricated as described above, brightness and chromaticity were measured in the beginning and after 5000 hours. The brightness was measured by turning on the light emitting apparatus at a forward current (IF) of 30 mA and measuring optical power (photocurrent) from the light emitting apparatus, and the chromaticity was measured using MCPD-2000 (manufactured by Otsuka Electronics Co., Ltd.).

On the other hand, a light emitting apparatus of Comparative Example 4 was fabricated in a manner similar to Example 4 except that the phosphor used was a green light emitting phosphor having a composition of $Eu_{0.05}Si_{11.93}Al_{0.07}O_{0.10}N_{15.90}$ (β-type SiAlON), and having an average particle size (d1) of 6.5 μm, a median diameter (50% D) of 19.5 μm, 50% D/d1 of 3.00, and an absorptance at 600 nm of 12.0%, as characteristic values.

For these light emitting apparatuses of Example 4 and Comparative Example 4, the characteristic (brightness and chromaticity) was evaluated in a manner similar to Example 1. The results are shown in Table 4. Table 4 shows that the light emitting apparatus of Example 4 is significantly brighter and has smaller fluctuations in brightness and chromaticity than the light emitting apparatus of Comparative Example 4.

TABLE 4

|  | Beginning | | | After 5000 Hours | | |
| --- | --- | --- | --- | --- | --- | --- |
|  | Brightness (Relative Value) | x | y | Brightness (Maintenance Rate) | x | y |
| Example 4 | 108.5% | 0.295 | 0.280 | 92.5% | 0.294 | 0.278 |
| Comparative Example 4 | 100.0% | 0.296 | 0.280 | 74.8% | 0.290 | 0.268 |

Light emitting apparatuses of Examples 5 to 9 and Comparative Examples 5 to 9 were fabricated in a manner similar to Example 4, except for using n-type SiAlON phosphors having various average particle sizes (d1), median diameters (50% D), values of 50% D/d1, and absorptances at 600 nm as shown in Table 5. The results of the characteristic (brightness and chromaticity) measured in a manner similar to Example 4 are shown in Table 6. Table 6 shows that the light emitting apparatuses of Examples 5 to 9 are significantly brighter and have smaller fluctuations in brightness and chromaticity than the light emitting apparatuses of Comparative Examples 5 to 9.

TABLE 5

|  | Composition | Average Particle Size (d1) (μm) | 50% D (μm) | 50% D/d1 | Absorptance at 600 nm (%) |
| --- | --- | --- | --- | --- | --- |
| Example 5 | Green: $Eu_{0.30}Si_{9.80}Al_{2.20}O_{1.00}N_{15.00}$<br>Red: $(Ca_{0.58}Sr_{0.40}Eu_{0.02})AlSiN_3$ | 15.0 | 21.8 | 1.45 | 4.5 |
| Comparative Example 5 | Green: $Eu_{0.30}Si_{11.95}Al_{0.05}O_{0.07}N_{15.93}$<br>Red: $(Ca_{0.58}Sr_{0.40}Eu_{0.02})AlSiN_3$ | 8.0 | 21.2 | 2.65 | 13.1 |
| Example 6 | Green: $Eu_{0.15}Si_{10.00}Al_{2.00}O_{0.50}N_{15.50}$<br>Red: $(Ca_{0.97}Mg_{0.02}Eu_{0.01})(Al_{0.99}Ga_{0.01})SiN_3$ | 9.2 | 17.0 | 1.87 | 7.0 |
| Comparative Example 6 | Green: $Eu_{0.15}Si_{11.85}Al_{0.15}O_{0.10}N_{15.90}$<br>Red: $(Ca_{0.97}Mg_{0.02}Eu_{0.01})(Al_{0.99}Ga_{0.01})SiN_3$ | 6.0 | 18.6 | 3.10 | 15.3 |
| Example 7 | Green: $Eu_{0.01}Si_{11.60}Al_{0.40}O_{0.20}N_{15.80}$<br>Red: $(Ca_{0.895}Sr_{0.100}Eu_{0.005})AlSiN_3$ | 16.0 | 34.9 | 2.18 | 7.5 |
| Comparative Example 7 | Green: $Eu_{0.01}Si_{11.85}Al_{0.15}O_{1.10}N_{15.90}$<br>Red: $(Ca_{0.895}Sr_{0.100}Eu_{0.005})AlSiN_3$ | 6.8 | 20.0 | 2.94 | 14.3 |
| Example 8 | Green: $Eu_{0.005}Si_{11.70}Al_{0.30}O_{0.15}N_{15.85}$<br>Red: $(Ca_{0.999}Eu_{0.001})AlSiN_3$ | 11.7 | 17.7 | 1.51 | 5.1 |
| Comparative Example 8 | Green: $Eu_{0.005}Si_{11.90}Al_{0.10}O_{1.15}N_{15.85}$<br>Red: $(Ca_{0.999}Eu_{0.001})AlSiN_3$ | 5.4 | 16.1 | 2.98 | 13.9 |
| Example 9 | Green: $Eu_{0.25}Si_{11.65}Al_{0.35}O_{0.30}N_{15.70}$<br>Red: $(Ca_{0.58}Sr_{0.40}Eu_{0.02})(Al_{0.98}In_{0.02})SiN_3$ | 14.3 | 23.6 | 1.65 | 6.2 |
| Comparative Example 9 | Green: $Eu_{0.25}Si_{11.85}Al_{0.15}O_{0.25}N_{15.75}$<br>Red: $(Ca_{0.58}Sr_{0.40}Eu_{0.02})(Al_{0.98}In_{0.02})SiN_3$ | 17.0 | 44.5 | 2.62 | 12.5 |

TABLE 6

|  | Beginning | | | After 5000 Hours | | |
| --- | --- | --- | --- | --- | --- | --- |
|  | Brightness (Relative Value) | x | y | Brightness (Maintenance Rate) | x | y |
| Example 5 | 109.9% | 0.260 | 0.235 | 92.1% | 0.259 | 0.234 |
| Comparative Example 5 | 100.0% | 0.259 | 0.235 | 75.5% | 0.253 | 0.225 |
| Example 6 | 108.0% | 0.270 | 0.250 | 93.4% | 0.269 | 0.247 |

TABLE 6-continued

| | Beginning | | | After 5000 Hours | | |
|---|---|---|---|---|---|---|
| | Brightness (Relative Value) | x | y | Brightness (Maintenance Rate) | x | y |
| Comparative Example 6 | 100.0% | 0.270 | 0.250 | 74.1% | 0.263 | 0.237 |
| Example 7 | 108.1% | 0.280 | 0.250 | 93.6% | 0.279 | 0.248 |
| Comparative Example 7 | 100.0% | 0.280 | 0.251 | 75.9% | 0.274 | 0.239 |
| Example 8 | 109.3% | 0.275 | 0.240 | 92.0% | 0.274 | 0.238 |
| Comparative Example 8 | 100.0% | 0.276 | 0.240 | 73.8% | 0.269 | 0.227 |
| Example 9 | 108.7% | 0.260 | 0.250 | 92.6% | 0.259 | 0.248 |
| Comparative Example 9 | 100.0% | 0.260 | 0.249 | 73.9% | 0.255 | 0.239 |

The light emitting apparatus of the present invention includes the light converter including the phosphor of the present invention. Such a light emitting apparatus of the present invention can efficiently absorb the primary light from the light emitting element, and can obtain white light with high efficiency, excellent color gamut (NTSC ratio), and good temperature and life characteristics.

When a liquid crystal display apparatus (TV) was configured by configuring a direct back-light light source apparatus in which a plurality of any of the light emitting apparatuses described above in Examples 1 to 9 were prepared and mounted in a matrix on a casing, and disposing an optical sheet and a liquid crystal panel on the back-light light source apparatus, a liquid crystal display apparatus having excellent color gamut was obtained. Further, the direct back-light light source apparatus may be replaced by an edge-light type back-light light source apparatus having a configuration in which a plurality of any of the light emitting apparatuses described in Examples 1 to 9 were prepared and disposed on a side surface of a light guide plate, and a reflective plate was installed on a back surface of the light guide plate, to obtain light from a front surface of the light guide plate.

It should be understood that the embodiments and examples disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: phosphor, 11, 21: light emitting apparatus, 12: light emitting element, 13: light converter, 14: phosphor other than the phosphor of the present invention, 15: medium.

The invention claimed is:

1. A light emitting apparatus, comprising:
    a light emitting element which is a gallium nitride-based semiconductor emitting primary light having a peak wavelength of 430 to 480 nm; and
    a light converter absorbing a part of said primary light to emit secondary light having a wavelength longer than a wavelength of the primary light, wherein
    the light emitting apparatus emits white light by color mixture of primary light and secondary light,
    said light converter including a green light emitting phosphor and a red light emitting phosphor,
    said green light emitting phosphor is a divalent europium-activated oxynitride green light emitting phosphor which is a β-type SiAlON substantially represented by a general formula (A): $Eu_a Si_b Al_c O_d N_e$ (where a, b, c, d, and e are numbers satisfying $0.005 \leq a \leq 0.4$, $b+c=12$, and $d+e=16$), and 50% D/d1 of 1.4 to 2.2 (where 50% D is a median diameter in particle size distribution and d1 is an average particle size determined by an air permeability method), and an absorptance at 600 nm of not more than 8.0%, and
    said divalent europium-activated oxynitride green light emitting phosphor satisfies 9 μm≤d1≤16 μm, and 12.5 μm≤50% D≤35 μm.

2. The light emitting apparatus according to claim 1, wherein the divalent europium-activated oxynitride green light emitting phosphor satisfies 10 μm≤d1≤13 μm and 50% D/d1 of 1.6 to 2.0.

3. The light emitting apparatus according to claim 1, wherein "c" satisfies $c \geq 0.3$ in the general formula (A).

4. The light emitting apparatus according to claim 1, wherein "a" satisfies $0.01 \leq a \leq 0.2$ in the general formula (A).

5. The light emitting apparatus according to claim 1, wherein said red light emitting phosphor is a divalent europium-activated nitride red light emitting phosphor substantially represented by a general formula (B): $(MI_{1-x}Eu_x)MIISiN_3$ (where MI indicates at least one alkaline-earth metal element selected from Mg, Ca, Sr, and Ba, MII indicates at least one trivalent metal element selected from Al, Ga, In, Sc, Y, La, Gd, and Lu, and x is a number satisfying $0.001 \leq x \leq 0.10$).

6. The light emitting apparatus according to claim 5, wherein MII in the general formula (B) is at least one element selected from Al, Ga, and In.

7. A back-light light source apparatus including a plurality of the light emitting apparatuses according to claim 1 as point light sources.

8. A liquid crystal display apparatus, comprising:
    a liquid crystal panel; and
    the back-light light source apparatus according to claim 7 disposed on a back surface of the liquid crystal panel.

9. The light emitting apparatus according to claim 1, wherein the absorptance at 600 nm of said divalent europium-activated oxynitride green light emitting phosphor which is a β-type SiAlON is not more than 7.0%.

* * * * *